United States Patent [19]

Misumi

[11] Patent Number: 5,492,862
[45] Date of Patent: Feb. 20, 1996

[54] VACUUM CHANGE NEUTRALIZATION METHOD

[75] Inventor: Takahiro Misumi, Tokyo, Japan

[73] Assignee: Tokyo Electron Limited, Japan

[21] Appl. No.: 179,309

[22] Filed: Jan. 10, 1994

[30] Foreign Application Priority Data

Jan. 12, 1993 [JP] Japan ................................ 5-019581

[51] Int. Cl.$^6$ ............................... H01L 21/26; H05F 3/06
[52] U.S. Cl. ........................................... 437/173; 361/213
[58] Field of Search .......................... 250/492.2, 492.21, 250/492.3; 437/173; 361/213

[56] References Cited

U.S. PATENT DOCUMENTS

| | | | |
|---|---|---|---|
| 4,042,971 | 8/1977 | Brennecke et al. | 361/213 |
| 4,333,123 | 6/1982 | Moulden | 361/213 |
| 4,523,985 | 6/1985 | Dimock | 250/492.2 |
| 4,553,069 | 11/1985 | Purser | 250/492.21 |
| 4,675,530 | 6/1987 | Rose et al. | |
| 4,724,222 | 2/1988 | Feldman | 250/492.2 |
| 4,786,814 | 11/1988 | Kolondra et al. | 250/492.2 |
| 4,804,837 | 2/1989 | Farley | |
| 4,982,138 | 1/1991 | Fujiwara et al. | 250/492.2 |
| 5,080,549 | 1/1992 | Goodwin et al. | |
| 5,099,557 | 3/1992 | Englesberg | 250/492.2 |
| 5,254,229 | 10/1993 | Ohmi et al. | 204/157.15 |
| 5,286,978 | 2/1994 | Yoshida et al. | 250/492.21 |
| 5,306,921 | 4/1994 | Tanaka et al. | 250/492.21 |
| 5,316,970 | 5/1994 | Batchelder et al. | 437/173 |

FOREIGN PATENT DOCUMENTS

| | | | |
|---|---|---|---|
| 546178A | 6/1993 | European Pat. Off. | 361/213 |
| 57-104218 | 6/1982 | Japan. | |
| 58-93323 | 6/1983 | Japan | 361/213 |
| 60-3121 | 1/1985 | Japan. | |
| 62-26756 | 2/1987 | Japan. | |
| 63-168949 | 7/1988 | Japan. | |
| 3-242929 | 10/1991 | Japan. | |
| 4-336421 | 11/1992 | Japan | 361/213 |

OTHER PUBLICATIONS

Translation of JP 57–104218.
Translation of JP 62–026756.

*Primary Examiner*—Brian E. Hearn
*Assistant Examiner*—Leon Radomsky
*Attorney, Agent, or Firm*—Graham & James

[57] ABSTRACT

A vacuum processing method including the steps of generating plasma of a charge neutralizing medium by plasma generating means in a vacuum process chamber, and supplying the charge neutralizing medium in the plasma state to an object during transportion in the vacuum process chamber, thereby neutralizing a charge on the object. With this method, the object can be smoothly transported in a vacuum atmosphere after treatment and adhesion of particles to the object is prevented.

4 Claims, 5 Drawing Sheets

VACUUM CHANGE NEUTRALIZATION METHOD

BACKGROUND OF THE INVENTION

1. Field of the Invention

The present invention relates to a vacuum processing method for transporting and treating an object in a vacuum atmosphere.

2. Description of the Related Art

In manufacturing a semiconductor wafer (hereinafter referred to as a wafer), various treatments are performed in a vacuum atmosphere. For example, a treatment of implanting an impurity into an object, i.e., a wafer, is performed by an ion implantation apparatus. This treatment is performed in the following manner: a wafer is extracted from a cassette in a process chamber maintained in a vacuum atmosphere by a handling device and disposed on a disk-like treatment table; and the treatment table is turned and slid, so that the entire surface of the wafer is scanned and uniformly irradiated with ion beams. In this treatment, to prevent the wafer from being charged and adhering to the treatment table, exciting species including ions generated by, for example, a plasma generating section in the process chamber, are irradiated on the wafer as an electron shower, thereby neutralizing the charge on the wafer. When this treatment is completed, the wafer on the treatment table is returned to the cassette by the handling device, and the cassette is transported to a next treatment section.

Since the wafer in treatment is subjected to the antistatic treatment as described above, it is prevented from adhering to the treatment table. However, after the treatment, in a case where the wafer is transported by the handling device, a high potential of several hundreds volts may be generated at a time when the wafer is removed from the treatment table. Owing to the high potential, the wafer is charged and adheres to the handling device. If the handling device, to which the wafer adheres, transports another wafer to or from the cassette, the wafers may be damaged and the wafer transportation may be hindered. Further, various problems, such as adhesion of particles to the charged wafer, may arise.

SUMMARY OF THE INVENTION

The present invention has been made to overcome the above problems, and its object is to provide a vacuum processing method, by which an object is smoothly transported in a vacuum atmosphere after treatment and adhesion of particles to the object is prevented.

The above object is achieved by a vacuum processing method comprising the steps of generating plasma of a charge neutralizing medium by plasma generating means in a vacuum process chamber; and supplying the charge neutralizing medium in the plasma state to an object to be transported in the vacuum process chamber, thereby neutralizing a charge on the object.

The above object is also achieved by a vacuum processing method comprising the steps of introducing a plasma of gas generated by plasma generating means arranged outside a vacuum process chamber; and supplying the plasma of gas to an object to be transported in the vacuum process chamber, thereby neutralizing a charge on the object.

According to the vacuum processing method of the present invention, the charge on the object transported in the vacuum process chamber can be sufficiently neutralized.

Therefore, even if a high potential of several hundreds volts is generated in the vacuum process chamber, the object is transported without adhering to the handling device. As a result, the object can be transported without damage and prevented from particle adhesion.

DETAILED DESCRIPTION OF THE PREFERRED EMBODIMENT

Embodiments of the present invention will be described in detail with reference to the accompanying drawings. In the following, a case, in which the present invention is applied to an apparatus for implanting ions into a wafer, is described.

Figure 1:
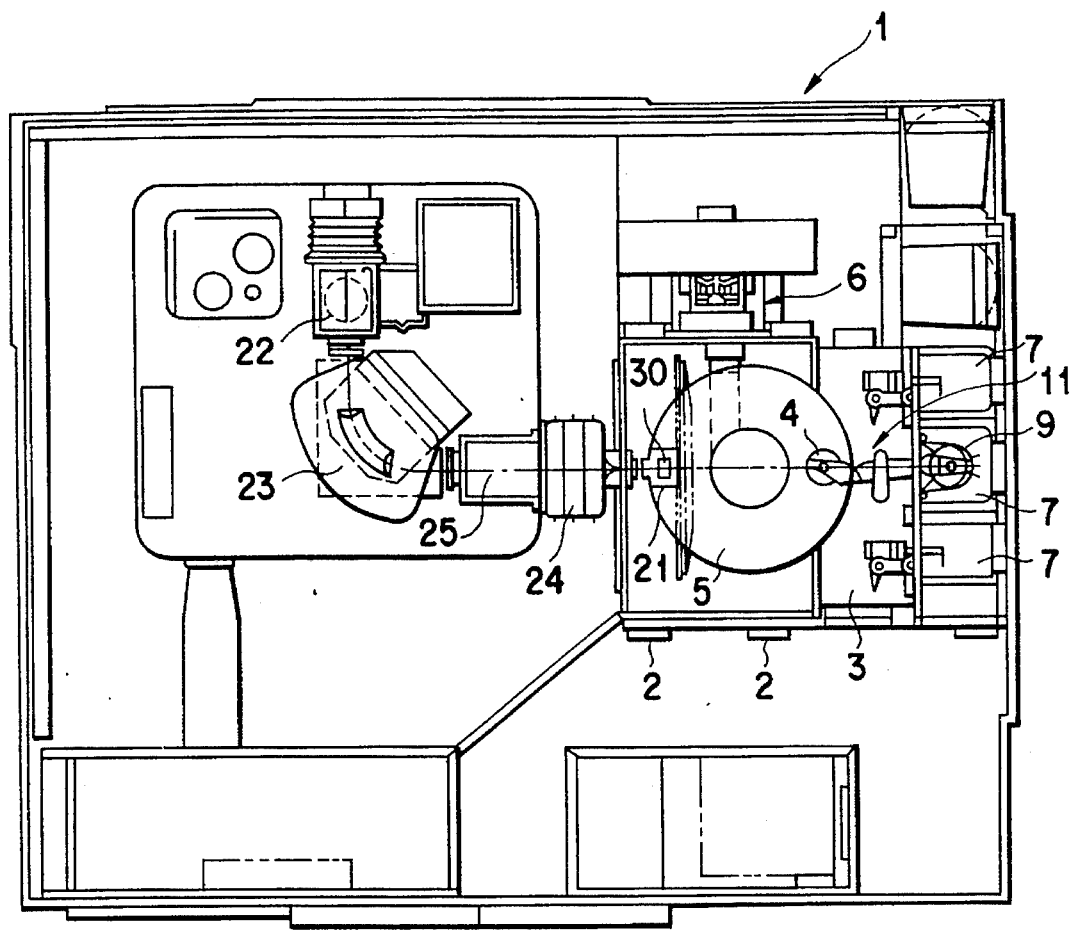
FIG. 1 is a plan view showing a treatment apparatus for performing a vacuum processing method of the present invention.

FIG. 1 is a plan view showing a treatment apparatus for performing a vacuum processing method of the present invention. In the drawing, a reference numeral 1 denotes an ion implantation apparatus. The ion implantation apparatus comprises a process chamber 3 kept evacuated by a vacuum apparatus 2. In the process chamber 3, a treatment table 5, on which objects to be treated, i.e., wafers, are disposed in a peripheral direction, is connected to a driving mechanism 6. The treatment table is circular, to be more accurate, shaped like a compressed cone nearly flat. The treatment table 5 is rotatable around a drive shaft of the driving mechanism 6 and movable up and down by means of the driving mechanism 6. Further, the treatment table 5 can be set in a lying or upright state so that the surface of the treatment table 5 is parallel or perpendicular to the horizontal. The process chamber 3 includes a plurality of cassette storage rooms 7, for storing cassettes 9 containing wafers, arranged adjacent to one another.

Figure 2:
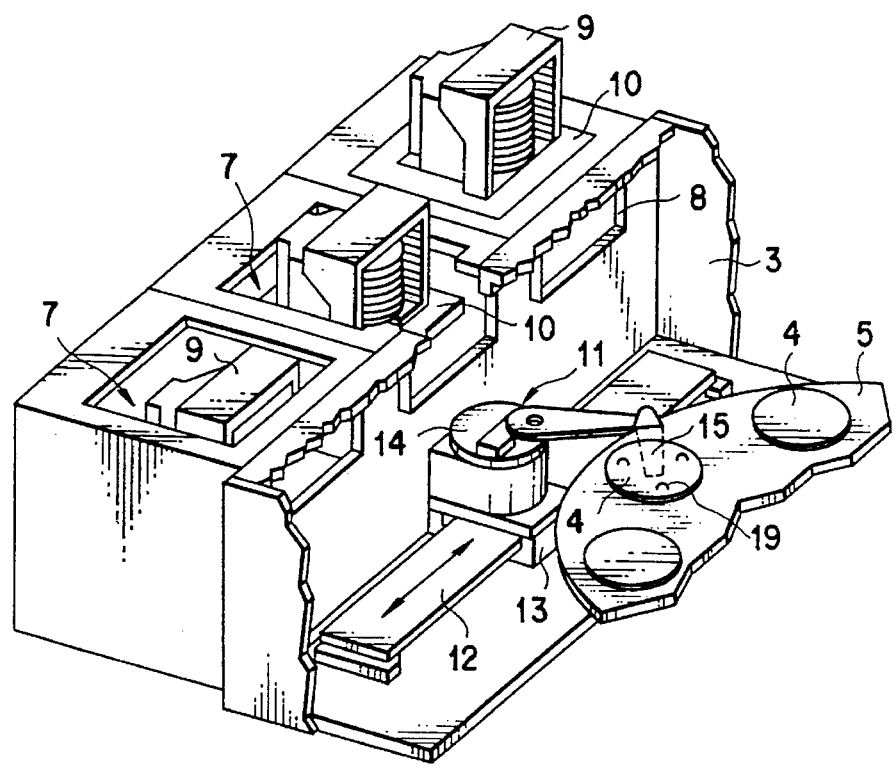
FIG. 2 is a perspective view showing part of the treatment apparatus shown in FIG. 1.

FIG. 2 is a perspective view showing a state in which wafers are transported into or from a cassette stored in a cassette storage room 7. As shown in FIG. 2, each of the cassette storage rooms 7 connected to with the process chamber 3 through a wafer transporting port 8. Each cassette storage room 7 is provided with an elevator 10, on which a cassette 9 holding a plurality of wafers horizontally at intervals is disposed. The cassette 9 can be moved up and down by means of the elevator 10. A sealing cover (not shown), for covering the cassette 9 moved upward by the elevator 10 and allowing passage of the wafers, is formed on an upper portion of the cassette storage room 7.

The process chamber 3 also includes a handling device 11 as wafer transporting means for drawing wafers 4 out of the cassette 9, disposing them on the treatment table 5 and returning treated wafers 4 from the treatment table 5 to the cassette 9. The handling device 11 is constituted mainly by a movable member 13 which is movable on a guide rail 12 extending substantially parallel with the row of the cassette storage rooms 7, a rotatable member 14 mounted on the movable member 13 and an extendible arm 15 connected to the rotatable member 14 and supporting the lower surface of the wafer 4.

Figure 3:
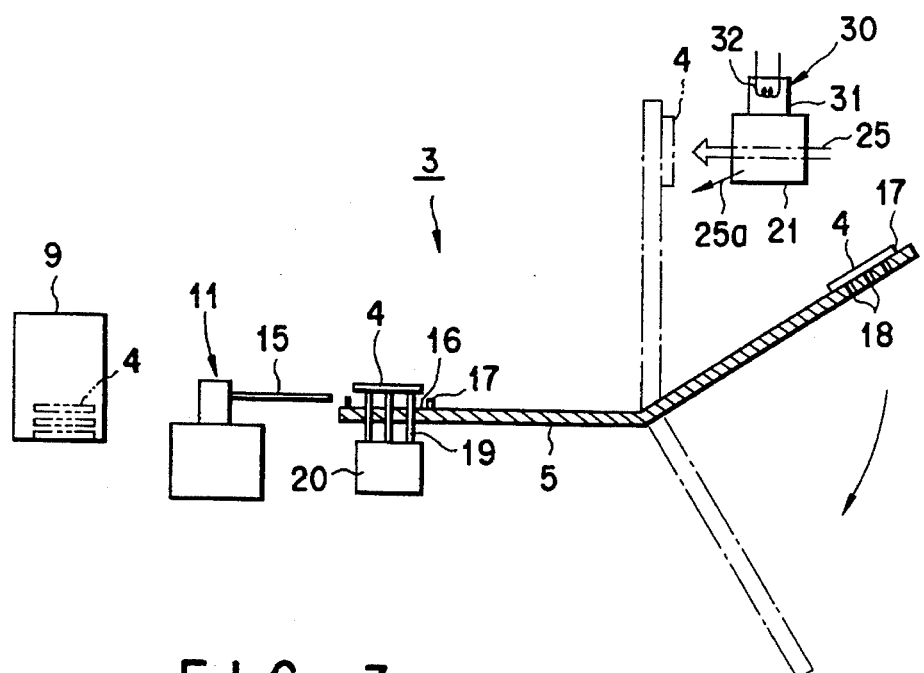
FIG. 3 is a schematic view for explaining the vacuum processing method according to an embodiment of the present invention.

As shown in FIG. 3, a number of wafer mounting portions 16 are formed along the periphery of the treatment table 5. Each of the wafer disposing portions 16 comprises a plurality of claws for holding the periphery of the wafer 4. Three pin holes are formed in the wafer disposing portion 16. A lifter 20, having pins 19 which are inserted through the pin holes 18 and movable up and down, is arranged near the handling device 11 so that the wafers 4 are transported to or from the arm 15 by means of the handling device 11 by moving the pins 19 up and down. When ion implantation is performed, the treatment table positioned in a preparatory position, i.e., a lying state indicated by the solid line, is rotated in a direction indicated by the solid arrow to an upright position, i.e., a standing state indicated by the virtual line, as shown in FIG. 3. A Faraday cup 21 is disposed opposing to the upper-most wafer 4 on the treatment table in the standing state. A plasma generating unit 30 is mounted on the Faraday cup 21, and performs a function of neutralizing the charge on the wafer 4, which has been ion-implanted by an ion beam 25.

Figure 4:
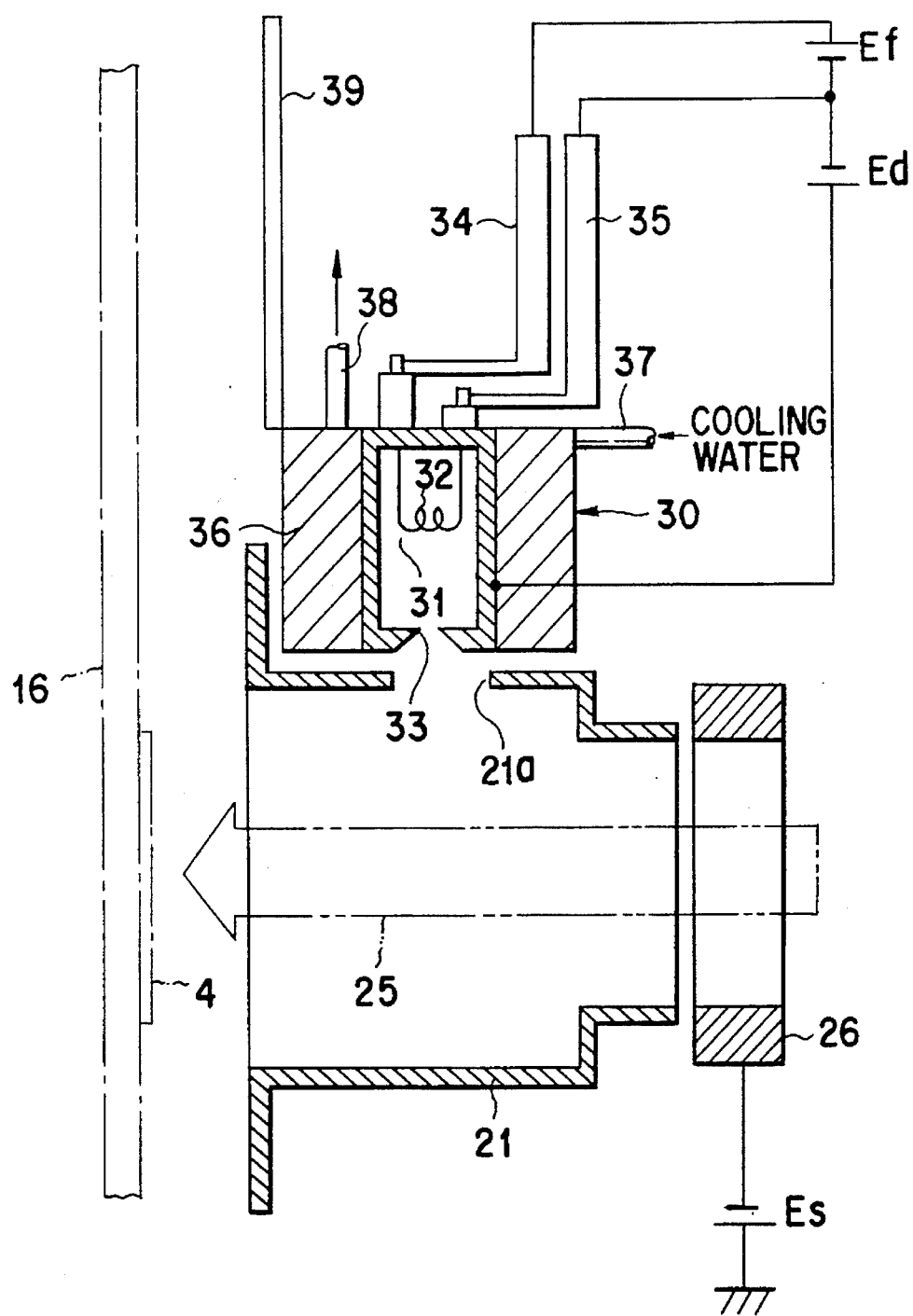
FIG. 4 is a cross-sectional view showing an example of ion neutralizing means used in the vacuum processing method of the present invention.

The Faraday cup 21 encloses secondary electrons generated by the ion implantation so that they do not flow out, in order to accurately measure the amount of ions implanted. In this case, as shown in FIG. 4, a suppress electrode 26 for applying a voltage $E_s$ of $-1000$ V is provided on a side of the Faraday cup through which the ion beam 25 is to be injected, so that the secondary electrons may not flow out. Further, as shown in FIG. 4, the plasma generating unit 30 comprises a filament 32 in a plasma generating region partitioned by a wall 31 formed of, for example, carbon or molybdenum. An opening 33 is formed in a portion of the wall 31, in proximity to the Faraday cup 21, so that the plasma can be allowed to flow into the Faraday cup 21. An opening 21a is formed in a portion of a pipe wall of the Faraday cup 21, in proximity to the opening 33. The openings 33 and 21a form a plasma flowing port.

The ends of the filament 32 are respectively connected to feeder members 34 and 35, each constituted by a terminal, a power supply plate, a power supply rod and the like. A power source for applying a filament voltage $E_f$ is connected between the power supply members 34 and 35. A power source for applying a discharge voltage $E_d$ is connected between the filament 32 and the wall 31 of the plasma generating region.

The wall 31 is housed in a cooling block body 36 formed of, for example, an aluminum alloy. A cooling water path (not shown) is formed in the block body 36 to cool the plasma generating region. The cooling water path is connected to cooling water pipes 37 and 38 so that the cooling water can circulate. A heat shielding plate 39 is attached to the block body 36, substantially parallel to the surface of the wafer disposing portion 16. By virtue of the heat shielding plate 39, even if a large amount of current flows through the power supply members 34 and 35 and the plasma generating region is heated to a high temperature (about 800° C.), the wafer 4 can be prevented from contamination by contaminant discharged from a .high temperature member and a circuit pattern on the wafer surface can be prevented from thermal deformation.

Referring to FIG. 1, the ion implantation apparatus 1 comprises an ion implantation unit. The ion implantation unit is constituted mainly by an ion source 22 for emitting positive ions generated by producing plasma of an introduced gas or a gas obtained by vaporizing a solid, an analysis magnet 23 for subjecting the ion beam 25 emitted from the ion source 22 to mass spectrometry in order to separate a desired ion, and an accelerating tube 24 for accelerating the ion beam 25 to the final energy. The ion beam 25 emitted from the ion source 22 of the ion implantation unit thus constituted is irradiated on the wafer 4 and a desired impurity is implanted into the wafer 4.

An embodiment of the present invention using the above apparatus will now be described. The ion beam emitted from the ion source 22 is subjected to mass spectrometry by the analysis magnet 23 and accelerated by the accelerating tube 24. Thereafter, it is irradiated on the wafer 4 disposed on the treatment table 5 through the Faraday cup 21, thereby implanting an impurity into the wafer 4.

Then, the filament 32 is heated by applying the filament voltage $E_f$ and thermoelectrons are generated. The thermoelectrons are introduced into the Faraday cup 21 by applying the discharge voltage $E_d$ to the Faraday cup 21. In the mean time, when the surface of the wafer 4 is charged with positive charge by irradiating the ion beam 25, potential gradient arises between the plasma generating region and the surface of the wafer 4. At this time, the thermoelectrons are drawn to the surface of the wafer 4 through the openings 33 and 21a, thereby neutralizing the positive charge on the wafer surface.

After the ion implantation treatment is performed as described above, the operation of the ion source 22 is stopped, the treatment table 5 is returned to the preparatory position and the wafers 4 are transported to the cassette 9 one by one by means of the lifter 20 and the handling device 11. At this time, the filament voltage $E_f$ is applied to the filament 32 and the discharge voltage $E_d$ is applied to the Faraday cup 21 again. The thermoelectrons 25a emitted from the filament 32 are accelerated by a positive voltage and supplied to the process chamber 3. As a result, the thermoelectrons 25a collide with a very small amount of gas molecules existing in the process chamber thereby generating ions, which neutralize the charge on the wafer 4. In other words, an electron shower of the thermoelectrons is generated by the above operation of the plasma generating unit or the thermoelectron generating unit 30, and the thermoelectrons react with the very small amount of gas existing in the process chamber 3, thereby generating ions, which neutralize charge caused by static electricity of a high potential generated when the wafer 4 is supported by the handling device 11. Therefore, the treated wafer 4 is prevented from adhering to the arm 15 of the handling device 11, thus accomplishing a smooth transporting operation, and is also prevented from particles adhesion. Further, since the plasma generating unit used in treating wafers is effectively utilized to neutralizing the charge which has been charged on the treated wafers during transportation, an additional charge neutralizing means is not required, thus simplifying the treatment apparatus and reducing the cost.

Figure 5:
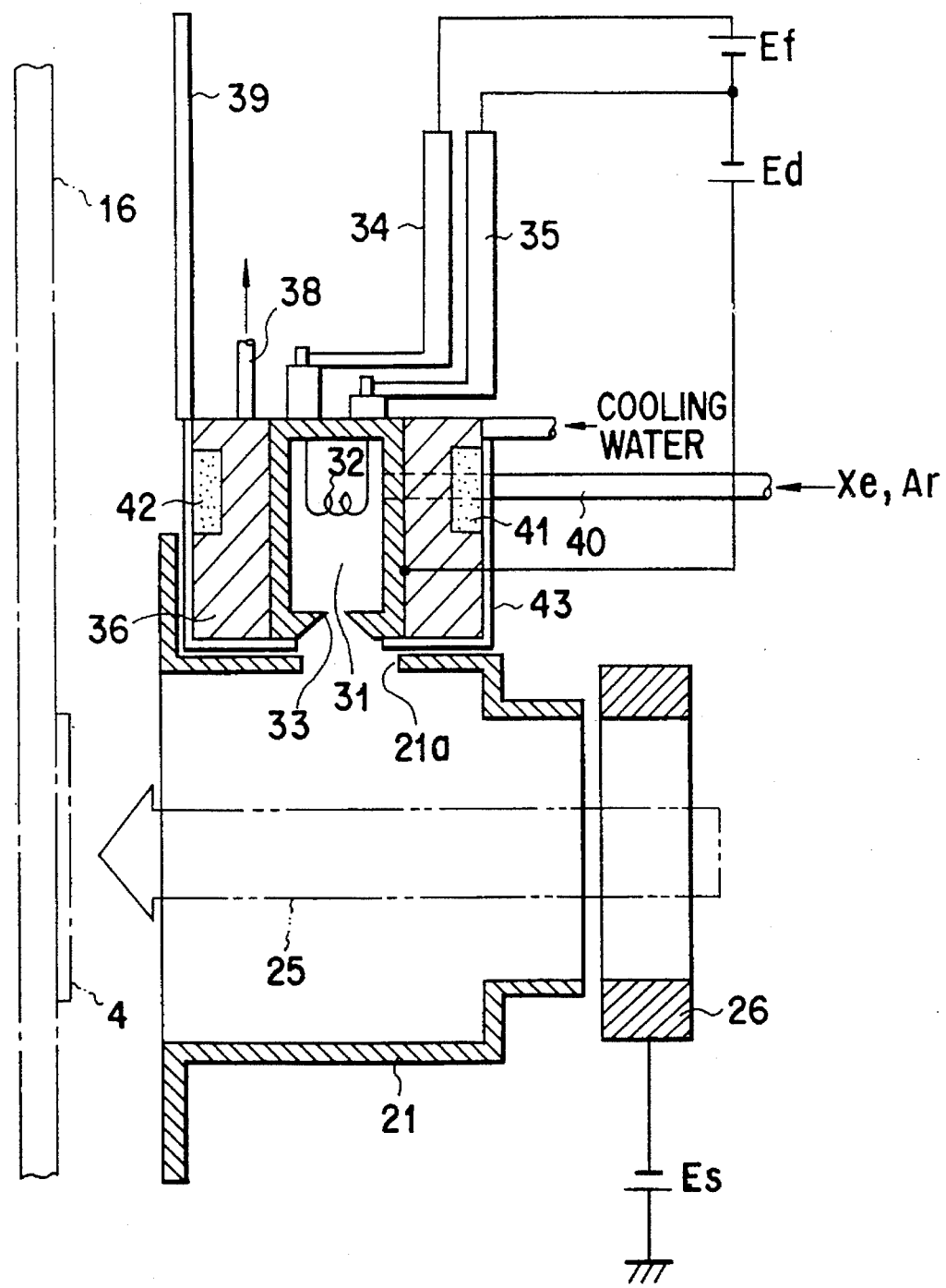
FIG. 5 is a cross-sectional view showing another example of ion neutralizing means used in the vacuum processing method of the present invention.

In the above embodiment, a small amount of gas remaining in the plasma generating region is used as charge neutralizing medium. However, gas can be positively introduced into the plasma generating region and the charge on the wafer can be neutralized by ions and electrons obtained by plasma of the gas. In this way, the charge neutralization can be further expedited. In this case, a constitution as shown in FIG. 5 is used. More specifically, a gas introducing pipe 40, for introducing an inert gas, such as xenon (Xe) gas, argon (Ar) gas, Krypton (Kr) gas, neon (Ne) gas or a gas obtained by vaporizing a solid inert compound, is formed so as to communicate with the plasma generating region. In addition, permanent magnets 41 and 42 are disposed in the block body 36. Each of the permanent magnets 41 and 42 is magnetized such that the inner side (the plasma generating region side) is the north pole and the outer side is the south pole. A magnetic shielding cover 43 covers the block body 36. The magnetic shielding cover 43 has a function of preventing the direction of movement of electrons, emitted from the plasma generating unit 30, from being restricted by the magnetic field applied to the Faraday cup 21 by the permanent magnets 41 and 42, so that the electrons are efficiently supplied to the surface of the wafer 4. In FIG. 5, elements the same as those in FIG. 4 are identified with the same reference numerals as used in FIG. 4, and descriptions thereof are omitted.

In the apparatus having the above constitution, gas is introduced through the gas introducing pipe 40 into the plasma generating region. The filament 32 in the plasma generating region is heated by the filament voltage $E_f$, hereby generating thermoelectrons, and the thermoelectrons excite the gas by the discharge voltage $E_d$, thereby generating plasma in the plasma generating region. Further, since the magnetic field is formed in the plasma generating region by the permanent magnets 41 and 42, the plasma can be generated efficiently. For this reason, a greater amount of ions and electrons are generated, thus effectively neutralizing the charge on the wafer 4, which has been charged during transportation. In this case, since the process chamber 3 is always vacuumed so that the gas supplied neutralize the charge on the wafer 4 is exhausted, the wafer is not adversely affected. In addition, as in the above embodiment, if the operation of the ion source 22 is stopped after the impurity is implanted in the wafer 4 by irradiating the ion beam 25 onto the wafer 4, and the gas is supplied to the process chamber 3 in the vacuum atmosphere to neutralize the charge on the wafer 4, when the wafer 4 is transported, the charge on the wafer 4 can be neutralized in a series of the steps of treatment and transportation.

Figure 6:
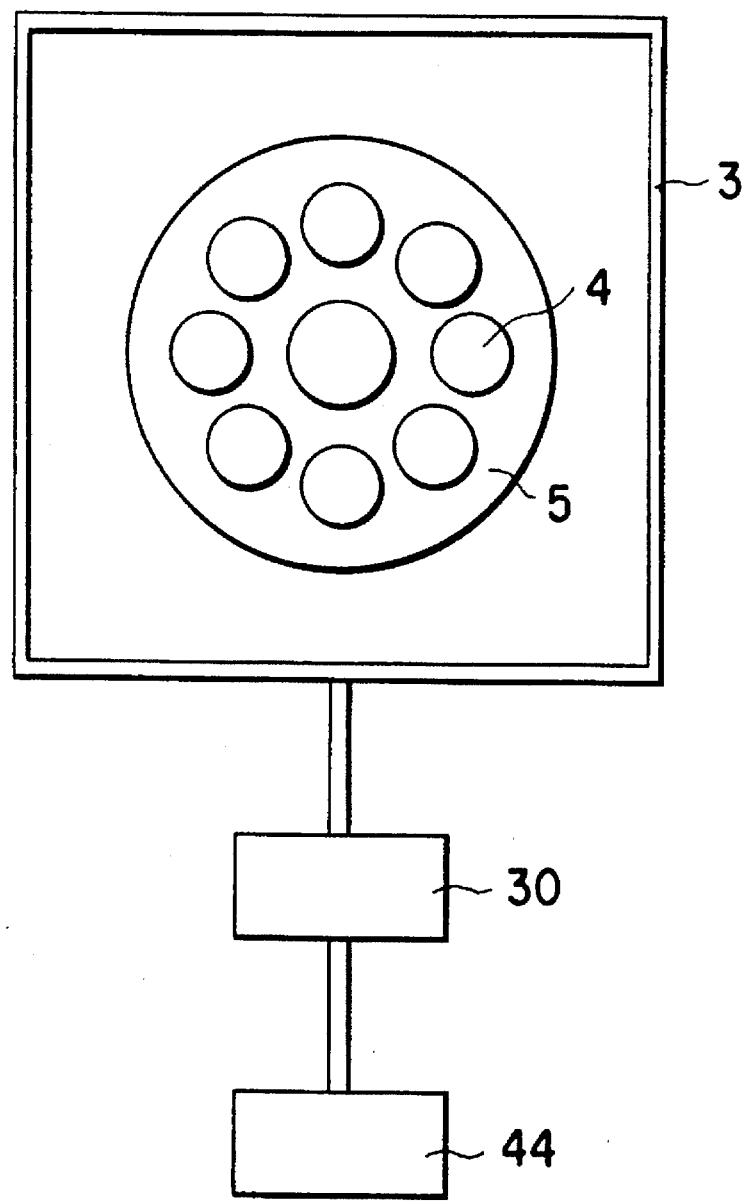
FIG. 6 is a schematic view for explaining the vacuum processing method according to another embodiment of the present invention.

In the above embodiment, the plasma generating unit with a filament is used as means for neutralizing the charge. However, means for generating plasma by a high-frequency power source can be used as means for neutralizing the charge, in which case the effect of the present invention can be also obtained. Further, although the plasma generating unit 30 is provided in the process chamber 3 in the above embodiment, the plasma generating unit 30 can be arranged outside the process chamber 3, along with gas introducing means 44, as shown in FIG. 6. In other words, gas introduced through the gas introducing means 44 can be changed to a plasma by the plasma generating unit 30 and the plasma can be introduced into the process chamber 3, thus neutralizing the charge on the wafer 4.

The present invention can be applied not only to an ion implantation apparatus but also to an apparatus for treating and transporting objects in a vacuum atmosphere, for example, an etching apparatus.

As has been described above, according to the vacuum treatment apparatus of the present invention, the charge neutralizing medium in the plasma state is supplied to objects transported in the vacuum chamber to neutralize the charge on the object. Therefore, when the treated objects are transported, the treated objects are prevented from adhering to the handling device, thus accomplishing a smooth transporting operation, and is also prevented from particles adhesion.

Furthermore, since the objects, which have been treated in the vacuum process chamber, are neutralized, the objects are prevented from adhering to the treatment table during the treatment process. In addition, when the treated objects are transported, they are prevented from adhering to the handling device. Thus, a smooth operation can be performed and particles are prevented from the objects during a series of steps of treatment and transportation in the vacuum atmosphere.

What is claimed is:

1. A vacuum processing method comprising the steps of:

generating thermoelectrons by thermoelectron generating means, during and after a treatment of an object, in a vacuum process chamber to neutralize a charge on the object;

extracting the generated thermoelectrons by a positive voltage causing them to collide with gas molecules in the vacuum process chamber, thereby generating ions and secondary electrons; and supplying the ions and secondary electrons into the vacuum process chamber to reneutralize a charge on the object during transportation of the object during a vacuum atmosphere.

2. The method according to claim 1 wherein said treatment of an object is a treatment for forming a semiconductor device.

3. The method according to claim 1, wherein said treatment of an object is a treatment selected from the group consisting of ion implantation, etching, sputtering, evaporation, CVD and diffusion.

4. The method according to claim 1, wherein the object is a semiconductor wafer.

\* \* \* \* \*